(12) United States Patent
Zhang (10) Patent No.: US 11,972,968 B2
(45) Date of Patent: Apr. 30, 2024

(54) FLUXLESS GANG DIE BONDING ARRANGEMENT

(71) Applicant: Jian Zhang, Brookline, MA (US)

(72) Inventor: Jian Zhang, Brookline, MA (US)

(73) Assignee: SHARPACK TECHNOLOGY PTE. LTD., Singapore (SG)

( * ) Notice: Subject to any disclaimer, the term of this patent is extended or adjusted under 35 U.S.C. 154(b) by 568 days.

(21) Appl. No.: 16/873,779

(22) Filed: Jul. 2, 2020

(65) Prior Publication Data

US 2022/0005720 A1    Jan. 6, 2022

(51) Int. Cl.
H01L 21/68       (2006.01)
H01L 21/67       (2006.01)
H01L 21/683      (2006.01)
H01L 23/00       (2006.01)
H05K 13/04       (2006.01)
H05K 13/08       (2006.01)

(52) U.S. Cl.
CPC ...... *H01L 21/681* (2013.01); *H01L 21/67144* (2013.01); *H01L 21/67259* (2013.01); *H01L 21/6838* (2013.01); *H01L 24/11* (2013.01); *H01L 24/13* (2013.01); *H01L 24/742* (2013.01); *H05K 13/0404* (2013.01); *H05K 13/0409* (2018.08); *H05K 13/0452* (2013.01); *H05K 13/046* (2013.01); *H05K 13/0465* (2013.01); *H05K 13/0812* (2018.08); *H05K 13/0882* (2018.08); *H01L 2224/11003* (2013.01); *H01L 2224/11005* (2013.01); *H01L 2224/11334* (2013.01); *H01L 2224/117* (2013.01)

(58) Field of Classification Search
CPC ............. H01L 21/681; H01L 21/67144; H01L 21/67259; H01L 21/6838; H01L 24/75; H01L 2224/7598; H05K 13/0452; H05K 13/0812; H05K 13/0882
See application file for complete search history.

(56) References Cited

U.S. PATENT DOCUMENTS

| | | | |
|---|---|---|---|
| 2007/0039686 A1* | 2/2007 | Makino | H01L 21/67144 438/106 |
| 2012/0210554 A1* | 8/2012 | Han | H01L 24/75 29/700 |
| 2019/0006211 A1* | 1/2019 | Seyama | H01L 21/67144 |

FOREIGN PATENT DOCUMENTS

WO    WO-2012133760 A1 * 10/2012    ....... H01L 21/67144

\* cited by examiner

*Primary Examiner* — Livius R. Cazan
(74) *Attorney, Agent, or Firm* — PRETI FLAHERTY BELIVEAU & PACHIOS LLP (57) ABSTRACT

The present invention features a system and manufacturing arrangement for multiple die chips onto a receiver substrate. The system includes a donor chuck; a receiver chuck configured for supporting the receiver substrate; a pick and place gripper mechanism configured for retrieving a die chip supported on the donor chuck; a gang carrier configured for receiving the die chip from the gripper mechanism; a flipper mechanism configured for delivering the die chip in an inverted orientation relative to the orientation of the die chip when received by the gang carrier; and computer controlled interconnected inspection cameras configured for ensuring accurate alignment of the receiver substrate relative to the die chip in the inverted orientation. The gang carrier has a thermocouple controlled heating element therein to maintain a proper computer controlled temperature therewithin.

9 Claims, 10 Drawing Sheets

FLUXLESS GANG DIE BONDING ARRANGEMENT

The present invention relates to the fluxless manufacture of integrated circuit chips for the computer industry, and is a continuation-in-part of co-pending U.S. patent application Ser. No. 15/998,298, filed Aug. 1, 2018, which is incorporated herein by reference in its entirety.

BACKGROUND OF THE INVENTION

Field of the Invention

The present invention relates to an arrangement for the manufacture of integrated circuit chips for the computer industry, and more particularly for the manufacture of such chips in a fluxless, "ganged" process to maximize efficiency of such manufacture. This "ganged" process is needed because, in modern electronics manufacture, more and more chips are integrated into a single chip module. This intense chip integration and compaction is comprised of vertical and horizontal arrangements. Horizontal arrangements or integration means a chip-to-substrate a wafer etc., while vertical arrangements or integration comprises a chip-to-chip attachment, or a package to package attachment. Arrangements of this sort in the prior art are very slow and are also likely to be polluted by virtue of the large quantities of flux and the deflux chemicals utilized therewithin.

BRIEF SUMMARY OF THE INVENTION

The system includes a first guided camera which is arranged over the donor chip chuck. A computer or system controller is connected to the first guided camera through a proper circuit. A die chip "pick and place" mechanical gripper hand arrangement is guided by the guided camera arranged over the chips and wafer. An arrangement of second and third guide cameras are also connected to the controller or computer through the proper circuit to those second and third guide cameras.

A storage or receiving chuck is arranged downstream of and underneath an arrangement of fourth and fifth guide cameras. The fourth and fifth guide cameras are connected to the controller or system computer through a proper circuit. An optional beam splitter may be arranged in optical communication with the fourth and fifth guide cameras to provide die images of a gang carrier as well as of the storage or receiving chuck which receives the chips from that gang carrier.

The process of the system begins with the 'pick and place' mechanical gripper hand arrangement picking up a die chip from the surface of the wafer on the die chip donor chuck under guidance from the first guide camera. The pick and place mechanical gripper hand then transports its collected die chip and deposits it on the elongated gang carrier. The deposition of that die chip is monitored and controlled by observation and manipulation of the mechanical gripper hand via the second camera number. After a plurality of die chips are sequentially arranged in adjacent longitudinal alignment on the gang carrier, the gang carrier with the die chips aligned thereon are transported over to the storage or receiving stage chuck and deposited thereon in an appropriate X, Y and Theta orientation typically with their solder bump side down, and controlled by the fourth and fifth guide cameras and the beam splitter, interconnected through the circuit, all in conjunction with and control by the controller. The beam splitter provides alignment images of the die chips of both on the elongated gang carrier and on the location for best positioning on the stage chuck or die receiver substrate.

The elongated array of die chips on the elongated gang carrier are flipped 180° during their orientation process by a flipper mechanism so that the solder bump side of the die chips in the elongated carried array is preferably facing downwardly. In this specification, solder bumps, solder balls and electroplated chips will all be considered technically equivalent and covered by the term "solder balls". There is also a category of "solderless" chips which are joined together by "fused oxides". For example, a small copper column is surrounded by silicon dioxide and under certain conditions of force and heat we get the silicon dioxide to be fused together which leads to copper to copper fused contact with each other. This is called the solderless fused joint.

To control the die chips on the elongated gang carrier, a vacuum system is arranged within the elongated gang carrier so as to securely keep the elongated array of solder laden die chips securely thereon during its "flip over" and subsequent deposition onto the substrate die receiver die receiver stage chuck. The X-Y-Theta positioning will be held to an accuracy of less than 1μ. The stage chuck preferably has heaters and/or thermal insulation to minimize any heat loss during the operation.

The elongated gang carrier includes vacuum channels along its upper surface to hold the die chips and the solder balls thereon during its flipping operation. The gang carrier also includes elongated chambers for channeling nitrogen and formic acid gases and an elongated heating element in a central chamber to maintain heat within that gang carrier while the die is still loaded thereon.

The flow process is depicted herewith somewhat in a generalized step-by-step description is as follows:

The first guide camera number takes images of the die pattern on the chip chuck;

a pick and place carrier picks a die chip from the wafer on the chip chuck, based on instructions it receives from the first guide camera;

the pick and place carrier places the die chip on to the gang carrier while the gang carrier is in a horizontal and die chip receiving orientation;

a flipper mechanism moves the gang carrier into alignment position over the substrate die receiver or stage chuck;

the second and third guide cameras take images of the gang carrier configuration of the die chip configuration on the substrate die receiver, (one image is reflected from the splitter, and one image is passed through the splitter to the fourth and fifth guide cameras);

the computer calculates the offsets based on the analysis of both of the images through the beam splitter;

the stage chuck adjusts its position according to the offset determined by the computer;

the flipper mechanism flips the elongated carrier to its proper die bonding position;

the elongated gang carrier begins flow of formic acid gas;

the elongated gang carrier leaves the dies vacuum held thereon;

the flipper mechanism applies a compression force to the now upside down die chip arrangement on the gang carrier;

the gang carrier shuts off the heater therewithin;

the gang carrier begins flow of nitrogen gas; and the flipper mechanism returns the elongated gang carrier, now released of an elongated array of die chips, to its received position for a new set to be placed thereon by the pick and place carrier mechanism.

The invention thus comprises a process for the manufacture of an integrated circuit component, comprising the steps: loading a solder ball and chip arrangement onto a donor chuck; monitoring the solder ball and chip arrangement by a computer-controlled camera arrangement; removing the solder ball and chip arrangement from the donor chuck by a computer-controlled gripper mechanism; moving the solder ball and chip arrangement via the gripper mechanism onto a computer-controlled gang carrier, the monitored by a second computer controlled camera arrangement; flipping the gang carrier about a horizontal axis so as to arrange the solder ball and chip arrangement into an inverted, solder ball side down orientation over a receiver chuck substrate, monitored and positionally controlled by a third computer-controlled camera arrangement; compressing the solder ball and chip arrangement onto the receiver chuck substrate by a computer-controlled compression rod so as to bond the solder ball and chip arrangement onto the receiver chuck substrate so as to form an integrated circuit assembly. The process may include the steps of: heating and bonding the solder balls to their respective chips as a pre-attachment assembly prior to their disposition onto the donor chuck; loading the gang carrier with a plurality of side-by-side solder ball and chip assemblies; heating the side-by-side solder ball and chip assemblies on the gang carrier; holding the side-by-side solder ball and chip assemblies in their inverted orientation within the gang carrier by an arrangement of controlled vacuum channels by a suction applied against the chips carried there within; cooling the side-by-side solder ball and chip assemblies by a computer-controlled nitrogen cooling channel arrangement within the gang carrier; exhausting gasses from within the gang carrier by an arrangement of exhaust channels through a housing around the gang carrier; arranging a vertically arranged displaceable spindle through the housing of the gang carrier, and engaging a computer controlled compression rod thereagainst, so as to force the heated side-by-side solder ball chip assemblies into solder ball deformation and attachment onto a further camera monitored location on the receiver substrate therebeneath; arranging the displaceable spindle through the housing of the gang carrier, and engaging the compression rod thereagainst, so as to force the heated side-by-side solder ball chip assemblies into solder ball deformation and attachment via a further camera monitored location onto a previously attached solder ball chip assembly located on the receiver substrate therebeneath; monitoring and controlling the placement of a heated side-by-side solder ball chip assembly through a beam splitter mechanism connected to a further camera arranged thereabove; applying a suction to the receiver chuck, bonding the now side-by-side solder ball chip assemblies to the receiver substrate for securement thereof wherein the solder ball and chip arrangement comprises a solder bump and chip arrangement.

The invention also comprises a system for the simultaneous assembly of multiple die chip sets onto a receiving stage chuck from a donor stage chuck, the system comprising: a holding die chip donor chuck member; a receiving stage chuck die chip receiver member; a pick and place gripper mechanism for retrieving a die chip set from the chuck supply member; a gang carrier for receiving a plurality of die chips from the pick and place gripper mechanism; a flipper mechanism for delivering a plurality of die chips in an inverted manner from the donor chuck onto the chuck die chip receiving member; and a plurality of interconnected inspection cameras controlled by a computer controller to ensure accurate alignment of die chip deposition onto the chuck die chip receiving member. The gang carrier may be modularized for the carrying of die chip arrangements. The gang carrier may be arranged to enable different size die chips carried thereon. The gang carrier may include a formic acid vacuum flow control arrangement to remove surface oxides, and control flow of any supplied formic acid/nitrogen gas mixture to create a local low oxygen environment within the gang carrier. The die chip on the die chip donor member the comprise an arrangement of solder bumps arranged on either side of the chip. The gang carrier may support a longitudinal array of die chips thereon. The respective die chip laden gang carriers are controlled by a flipper mechanism so as to enable the rotational movement of each gang carrier from one die chip solder-ball orientation 180° about its longitudinal axis to a second die chip solder-ball orientation. The die chips are preferably held securely to the respective gang carriers by a vacuum channel arrangement within the gang carrier. The gang carrier preferably has a thermocouple controlled heating element therein to maintain a proper temperature therewithin. The gang carrier has a cooling system therein for the flow of nitrogen around the die chips during heating thereof. The gang carrier preferably has an exhaust system therein to remove used nitrogen and formic acid vapors from the die chip environment.

The invention also comprises a process for the deposition of ganged assembly of chip die sets on a receiving wafer, comprising one or more of the steps as: picking up pre-assembled die chips serially, from a source supply wafer by a gripper mechanism; loading the pre-assembled picked-up die chips onto an elongated gang die chip carrier; inverting the elongated gang die chip carrier with its preassembled picked-up die chips thereon; and depositing the pre-assembled picked-up die chips, upside down from the orientation in which they were picked up by the gripper mechanism, onto a receiver substrate on a receiving chuck for final assembly thereon. The gang die chip carrier is arranged to provide: securing of the die chips thereon by a vacuum holding arrangement within the gang carrier; applying a rapid heating and/or nitrogen cooling and/or compression rod compressing of the picked-up die chips so as to bond the picked-up die chips to a selected receiver site on a receiver substrate; and controlling any formic acid flow to remove surface oxides and facilitate flow of formic acid/nitrogen gas mixture to create a local low oxygen environment within the elongated gang carrier. A compression force may be applied during the vacuum bonding of the die chips on the receiver substrate. The picking up, loading, inverting and the depositing steps of the die chip assembly process are each monitored and positionally controlled by a series of computer-controlled cameras.

The invention also preferably includes an arrangement for the manufacture of a die chip assembly onto a receiver substrate, comprising: a donor chuck supporting a chip carrier with a preassembled die chip arrangement thereon; a guide camera monitored die chip gripper arrangement for removing a preassembled die chip from a donor chuck and deposition of the preassembled die chip onto a guide camera monitored die-chip-heating gang carrier; a flipper arrangement for inverting the preassembled die chip from an original orientation on a donor chuck onto a a second orientation rotated by a 180° onto a receiver substrate; and a biasing arrangement extending through the gang carrier to press the preassembled die chip into a solder ball distorting die chip bonding onto the receiver substrate. The receiver substrate is preferably vacuum supported on a receiver chuck, wherein the receiver chuck is displaceable, vertically, rotationally and transversely via a guide camera arrangement in communication with the control computer to enable locationally controlled deposition of die chip bonding on the receiver substrate.

The present invention also comprises the fluxless manufacture of an integrated circuit for the computer industry, comprising the steps: providing a fluxless array of pre-assembled die chips on a donor chuck arrangement; picking up a preassembled die chip from the donor chuck arrangement by a gripper, under guidance from a first connected camera connected to a control computer; delivering the preassembled die chip in the aligned manner, by the gripper onto a guide camera monitored computer-controlled gang carrier; rotationally moving the gang carrier so as to invert the preassembled die chip thereon; depositing the inverted die chip assembly onto a receiving chuck, guided positionally by a further guide camera; and controllably pressing the inverted die chip assembly by a computer-controlled compression rod assembly, thereby compressing each die chip against a receiver substrate supported on the receiver chuck so as to comprise the integrated circuit. The process may include suctioning the die chip on the gang carrier during the rotational movement and inversion of the die chip thereon; aligning the depositing of each die chip on the receiver substrate by a guide camera visualization arrangement of the die chip on the gang carrier and the location of deposition on the receiver substrate by an optical beam splitter in communication with the control computer, wherein the donor chuck arrangement comprises a first donor chuck and the second donor chuck. The preassembled die chips on the first donor chuck may be of a first size and wherein the preassembled die chips on the second donor chuck are of a second size, different from the die chips of the first size.

DETAILED DESCRIPTION OF THE DRAWINGS

The objects and advantages of the present invention will become more apparent when viewed in conjunction with these drawings, in which.

DETAILED DESCRIPTION OF THE INVENTION

Figure 1:
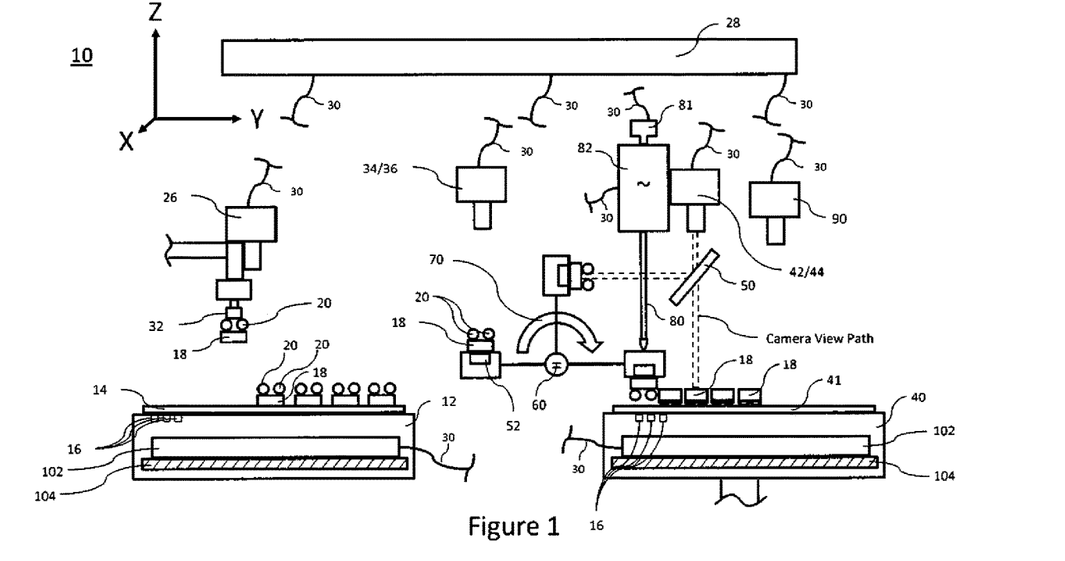
FIG. 1 represents a side elevational view of the components and their operation with respect to the present invention.

Referring now to the drawings in detail, and particularly to FIG. 1, the present invention shown comprises an electronic chip manufacturing system 10 where multiple chips are ganged together for bonding as a chip assembly without the need for the flux or de-fluxing chemicals typical of prior art arrangements. The assembly system 10 is represented in FIG. 1 as a side elevational view showing a heated donor chuck 12 with a non-aligned or irregular array of preliminarily assembled die chips 18 shown with their respective solder balls (or bumps) 20 thereon, carried on a tape frame or carried within a tray 14 thereon, preassembled and then brought to the donor chuck 12 for subsequent processing. The tape frame or tray 14, herein after referred to as a chip carrier 14, is preferably held to the donor chuck 12 by an array of vacuum channels 16 arranged therewith, the plurality of donor die chips 18 with their respective solder bumps 20, are arranged here with their solder bumps "face-up" and "lightly" preliminarily preassembled bonded onto the chip 18, in a generally un-aligned manner on the donor chip carrier 14 without the use of flux components typical of the prior art. The term "pre-assembled" signifies a flux-free attachment of solder balls 20 onto a first or upper surface of the chip 18 sufficient to maintain their position during the ongoing processing thereof. For convenience, the combination of solder balls or bumps 20 on a chip 18, will be designated as "die chip 18" going forward.

Figure 2:
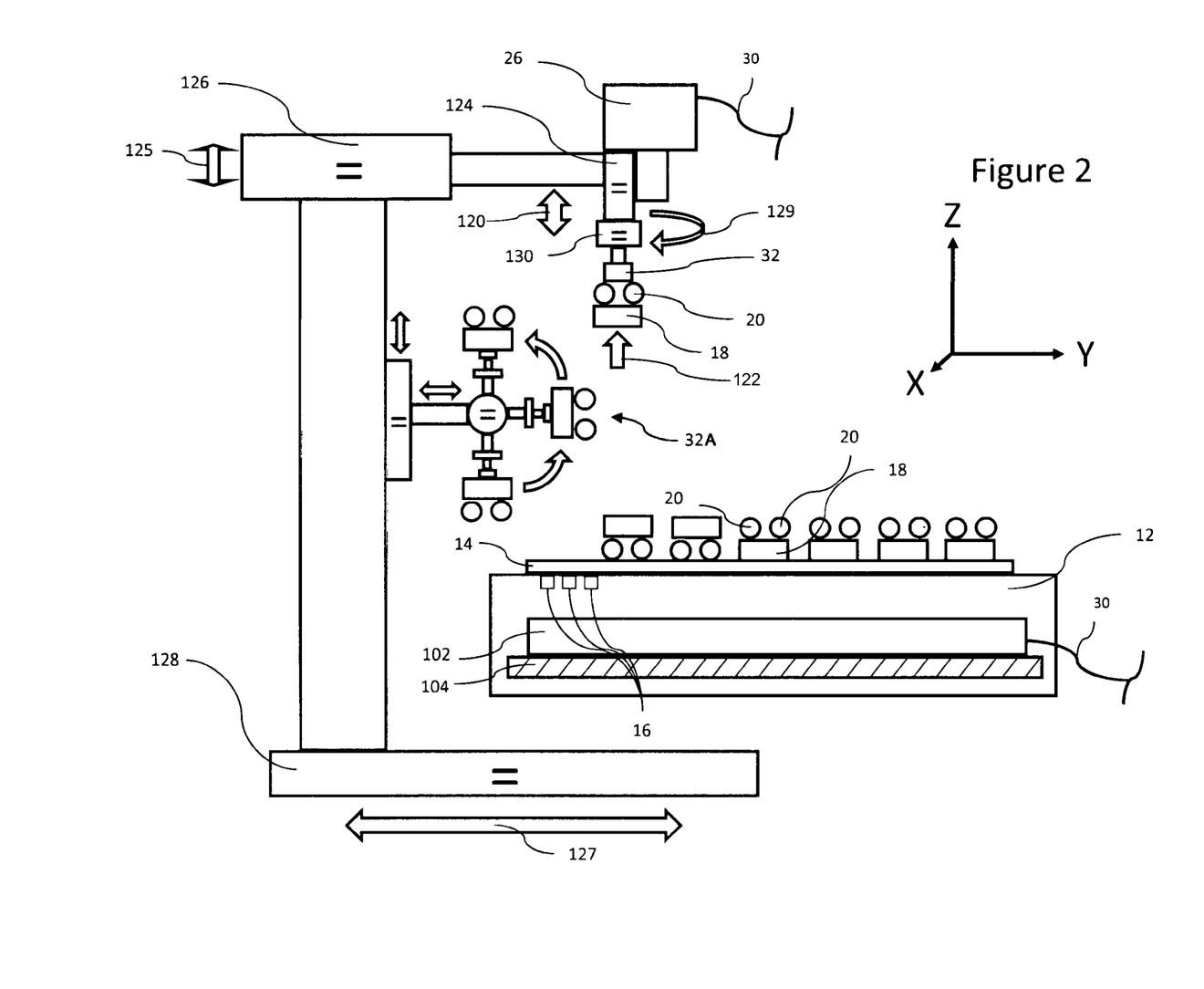
FIG. 2 represents a more detailed side elevational view of the components on the left side of FIG. 1 with additional die chip gripping components and functions represented.

A first guide camera 26 is arranged over the donor chuck 12 as represented in FIG. 1. A computer or controller 28 is connected to the 1st guided camera 26 through a proper circuit 30. A chip "pick and place" mechanical gripper 32 guided by the guide camera 26 is shown arranged over the balls 20 and chips 18 and chip carrier 14 as represented in the left-hand side of FIG. 1. The mechanical gripper 32 is mounted to a servo motor stack which comprises a series of servomotors consisting of a rotating (theta) actuator 130, best shown in FIG. 2, which rotates the gripper 32 about the "Z" axis 129, and a linear Z actuator 124. This servomotor stack, along with the first guide camera 26, are in turn mounted on stacked pair of linear servomotor actuators 126 and 128 which move in the "X" direction 125 and the "Y" direction 127 respectively. An arrangement of the second and third guide cameras 34 and 36 are disposed above an elongated chip gang carrier 52, as shown in FIG. 1, and are connected to the controller or computer 28 through the proper circuit 30. A further chip "pick and place" chip-orientation-correcting mechanical gripper 32A is also shown in FIG. 2 as a further embodiment, wherein the chip-orientation-correcting gripper 32A may pick up die chips 18 for removal from a donor chuck 12 for subsequent deposit on the gang carrier 52 wherein the die chips 18 are already inverted with their solder ball side down. A further embodiment of the mechanical grippers 32 and 32A will be integrated together and the decision by the system 10 to flip or not to flip a die chip 18 will be based upon the analysis by the controller or computer 28 in conjunction with the first camera 26 in communication with the controller or computer 28.

In either case, a receiver chuck 40 is shown downstream of the donor chuck 12 in FIG. 1, with a receiver substrate 41 (wafer, PCB, panel, packages in tray) thereon, the receiver chuck 40 is vertically, horizontally and rotatively displacable (described hereinbelow) and disposed beneath an arrangement of fourth and fifth guide cameras 42/44. The guide cameras, including the fourth and fifth guide cameras 42/44 are all connected to the controller or computer 28 through the proper circuit 30, as represented in FIG. 1. An optional beam splitter 50 may be arranged in optical communication with the fourth and fifth guide cameras 42/44, to enable simultaneous imaging of the gang carrier 52 as well as of the receiver substrate 41, which substrate 41 is arranged to releasably receive the bump loaded die chips 18 from the gang carrier 52. The receiver chuck 40 is driven by a series of servomotors 132, 134, and 136 which actuate it in the "X" direction 131, the "Y" direction 133, and the Theta directions 135 respectively, best represented in FIG. 3.

Figure 6:
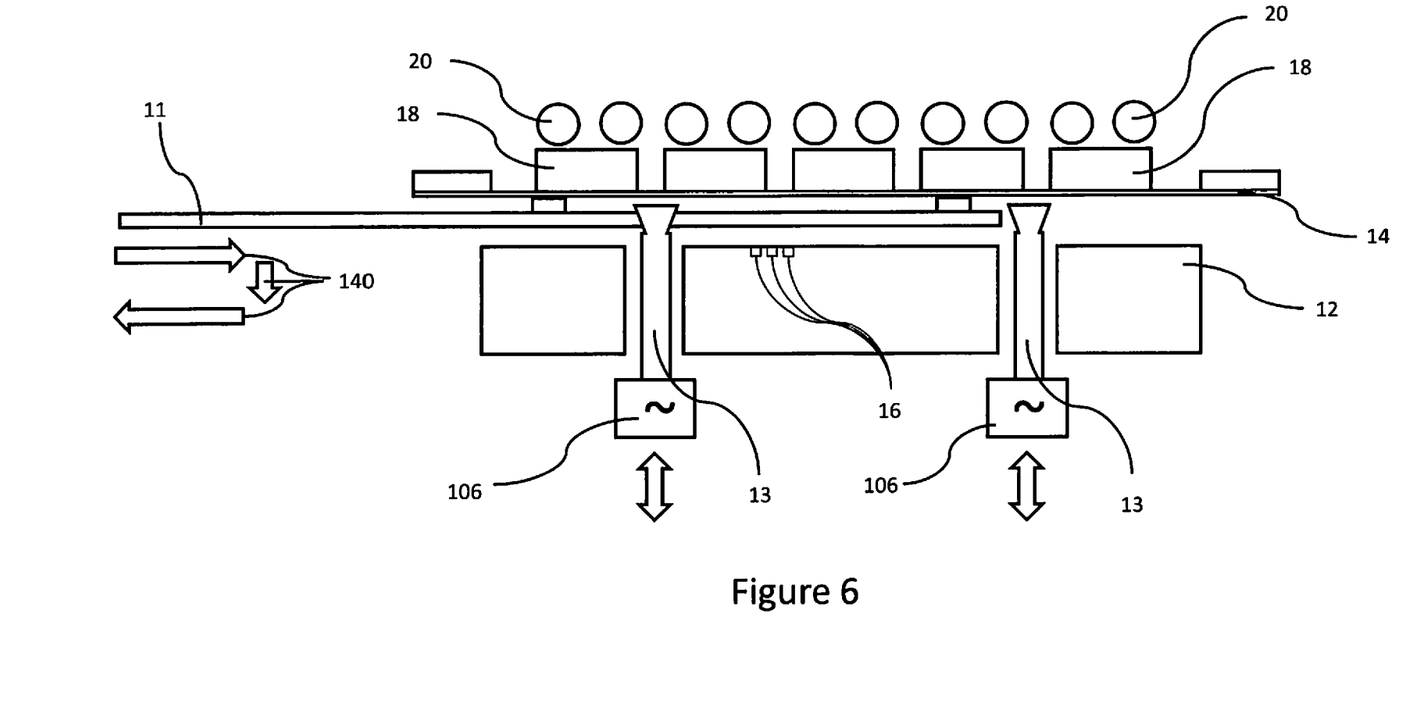
FIG. 6 represents an edge view in cross-sectional detail of the process by which a substrate is loaded into the present invention.
Figure 7:
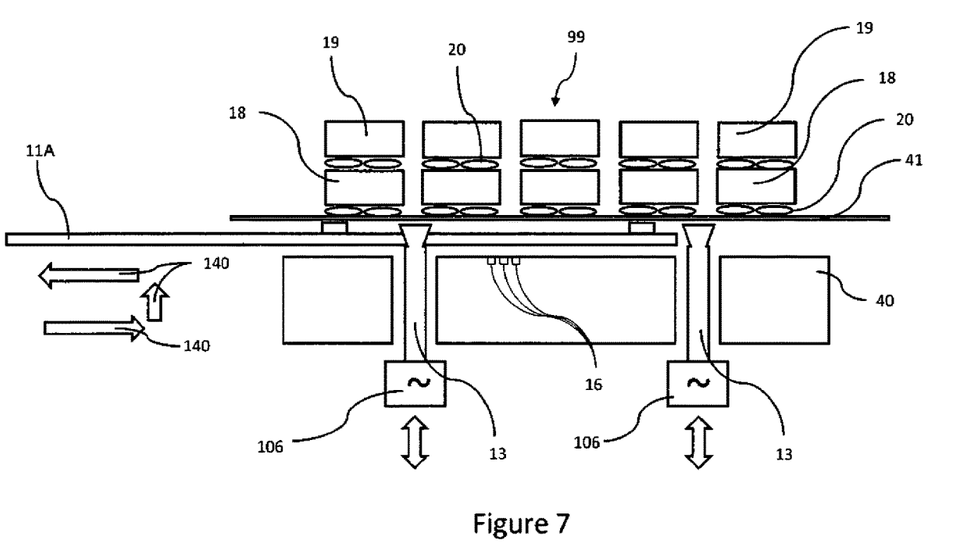
FIG. 7 represents an edge view in cross-sectional detail of the process by which a substrate is unloaded from the present invention.

The chip carrier 14 is loaded and unloaded 140 from the donor chuck 12 by means of an external end effector 11, shown in FIG. 6. The end effector 11 places the chip carrier 14 on an arrangement of lift pins 13 actuated by pneumatic cylinders 106 shown in FIG. 6. The lift pins 13 then recess below the upper surface of the donor chuck 12. The chip carrier 14 is held in place by an arrangement of vacuum channels 16 within the donor chuck 12 as shown in FIGS. 1 and 2. The receiver substrate 41 is loaded and unloaded with respect to the receiver chuck 40 in a similar manner, as illustrated in FIG. 7. A second end effector 11A places the receiver substrate 41 on an arrangement of mechanically actuated lift pins 13. The lift pins 13 then movably recess below the upper surface of the receiver chuck 40, the receiver substrate 41 being held in place on the upper surface of the receiver chuck 40 by an arrangement of vacuum channels 16 arranged within the receiver chuck 40.

The process of the system 10 may begin with the pickup of at least one die chip 18, from the donor chuck 12 by the gripper 32, represented on the left side of FIG. 1, and in more directional detail in FIG. 2, further described hereinbelow, and with subsequent inverted release and computer controlled placement of the die chips 18 from the chip carrier 14, and onto the receiver substrate 41, as may be seen in FIG. 3.

Figure 3:
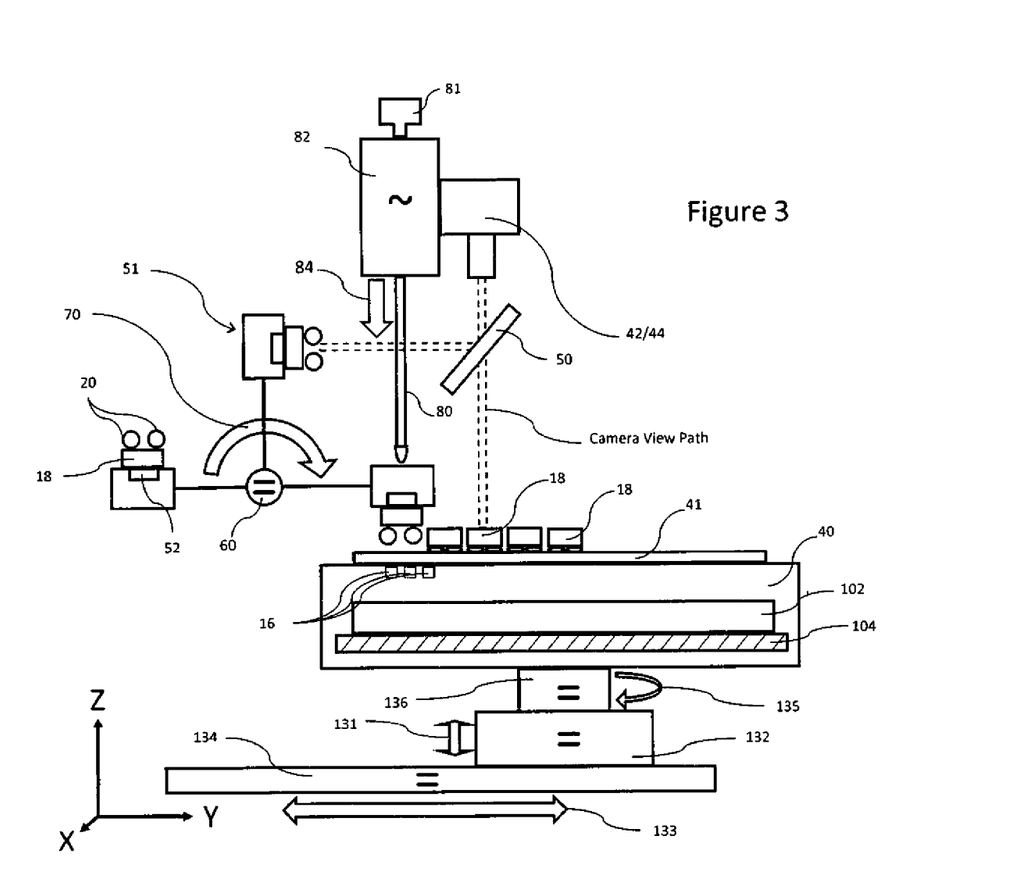
FIG. 3 represents a more detailed side elevational view of the components on the right side of FIG. 1 with additional components and functions represented.

In one preferred embodiment this die chip 18 release is done by conductively heating the chip carrier 14 using the heatable donor chuck 12, which donor chuck 12 is computer controllably heated by a flat heating element 102, as shown in FIGS. 1, 2 and 3, typically to a temperature of about 300° C. The solder balls 20 and chip 18 having been preliminarily heated to secure solder balls to die chip 18, (not part of the current process).

Figure 4:
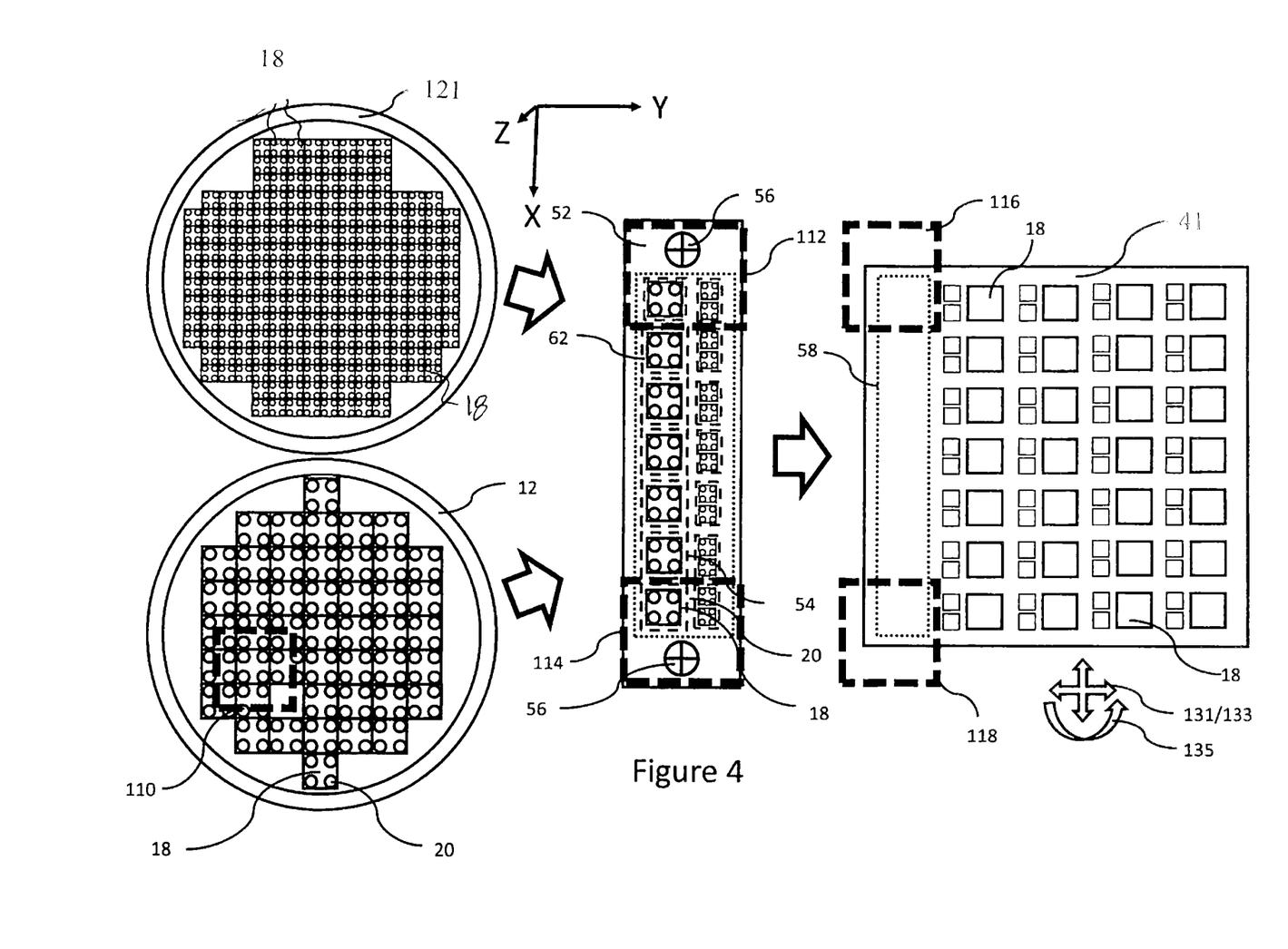
FIG. 4 represents a plan view of certain major components of the invention represented in FIG. 1, with an identification of modification of those components such as multiple donor chuck arrangements, multiple sizes of die chips and the processes utilized therewith.
Figure 5:
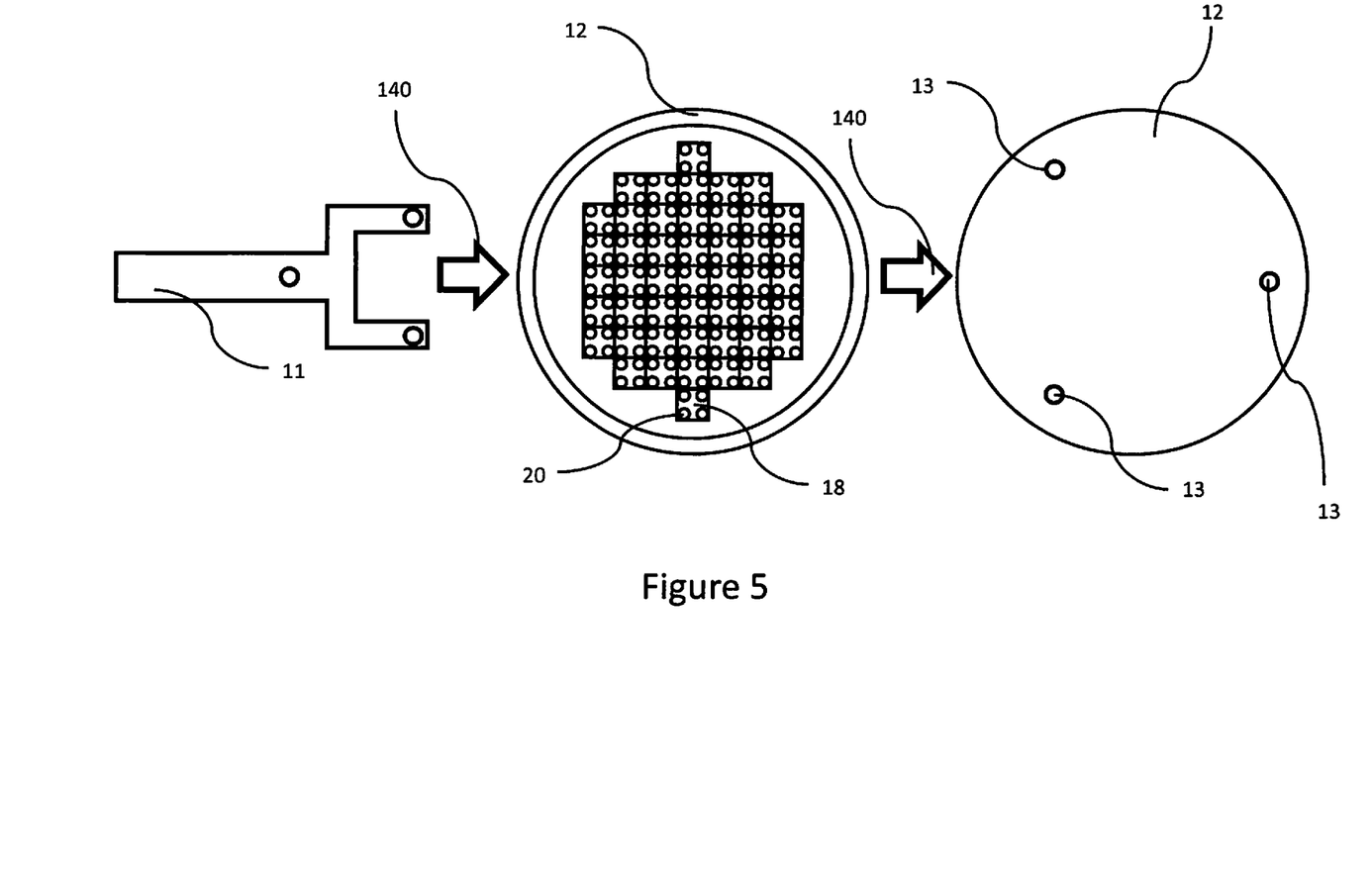
FIG. 5 represents a plan view of the process by which a substrate is loaded into the present invention.
Figure 10:
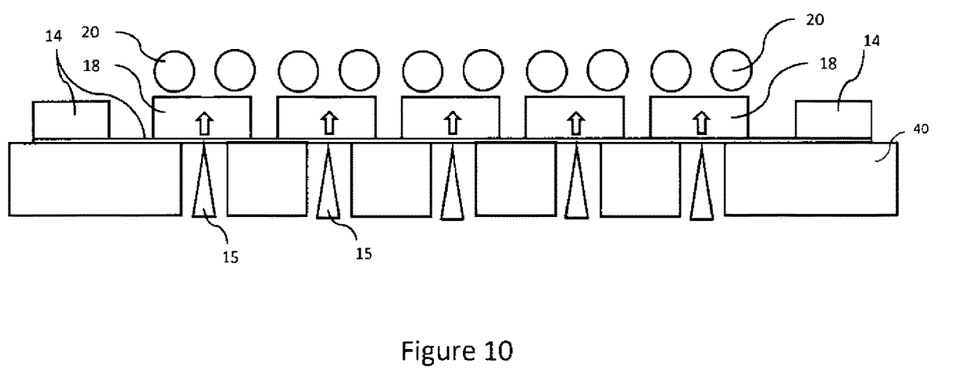
FIG. 10 represents an edge view in cross-sectional detail of an alternative embodiment of a donor chuck member shown in FIG. 1.

In another preferred embodiment, represented in FIG. 10, this is done by actuating a lift arrangement (not shown) for longitudinally displacing an array of ejector pins 15, so as to rise up through the surface of the donor chuck 12 and pass through an array of openings in the chip carrier 14. These pins 15 push up on the die chips 18 themselves and forcibly separate the chips 18 from the tape frame or chip carrier 14 as shown in FIG. 10. The second and third guide cameras (34/36) each take an image (112/114) of a fiducial mark alignment feature 56 on the gang carrier 52, as shown in FIG. 4. A CAD model based alignment algorithm on the computer or controller 28 then uses these images to calculate and enable the precise positioning of the gang carrier 52 on the receiver chuck 40, as represented in FIGS. 4 and 7. This process involves the pick and place mechanical gripper 32 then moving over a die chip 18 wherein the first guide camera 26 takes an image 110 of this die chip 18. The computer or controller 28 then calculates the precise alignment and position of the die chip 18 relative to the gang carrier 52 using a CAD based alignment algorithm. The mechanical gripper 32 then lifts (as indicated by the arrow 122 on FIG. 2), the die chip 18 from the surface of the chip carrier 14 on the donor chuck 12 by actuating in the "Z" direction 120, best seen in FIG. 2. The mechanical gripper 32 transports the die chip 18 to the elongated gang carrier 52 and then releasably deposits the die chip 18 on the gang carrier 52, the gang carrier 52 being most clearly shown in FIGS. 3 and 4. During transport, the mechanical gripper 32 aligns each die chip 18 to a target position 54 on the gang carrier 52, as shown in FIG. 4, as determined by the computer or controller 28 using a CAD based alignment algorithm.

After a plurality of die chips 18 are arranged in a longitudinal array 62 on the gang carrier 52, wherein the die chips 18 are in adjacent longitudinal alignment with respect to one another, as represented in the middle of FIG. 4, the second and third guide cameras 34/36 shown in the middle of FIG. 1, take images (112/114) of the gang carrier 52 and die chips 18 represented in the middle of FIG. 4. The fourth and fifth guide cameras 42/44 shown on the right side of FIG. 1 then take images (116/118) of the of the receiver substrate 41 shown in FIG. 4, and then the computer or controller 28 calculates the precise orientation of the longitudinal array 62 on the gang carrier 52 with respect to the desired receiver landing area 58 on the receiver substrate 41. The receiver chuck 40 then moves in the X, Y, and theta directions (131, 133, and 135), as necessary, to the appropriate orientation as shown in FIG. 4, controlled by the computer or controller 28 through the appropriate circuit 30, such that when the gang carrier 52 transports the die chips 18 to the receiver substrate 41 each die chip 18 is deposited in the proper aligned location. The gang carrier 52 with the die chips 18 aligned thereon are then transported by the servomotor driven flipper 60 over the receiver substrate 41 and deposited thereon, with the bump 20 arranged downwardly, as represented in FIGS. 1 and 3. When in its "bump 20 down" chip deposition orientation, the flipper 60, through control by the control computer 28 controls the exact height of the heated and now bonded die chip 18 with respect to the receiver substrate 41, for subsequent use as an integrated circuit 99. FIG. 4 also depicts a further or second donor chuck 121 wherein the die chips 18 thereon are of different size than the die chips 18 shown on the first donor chuck 12. Such a mix of donor chucks 12 and 121 thereby enable the ultimate assembly of mixed size die chips 18 on the receiving substrate 40.

In another embodiment the flipper 60 moves the gang carrier 52 to an intermediate position 51, as represented in FIG. 3, so as to be in optical communication with a beam splitter 50 which is also in optical communication with the receiver substrate 41, as shown in FIG. 1. The fourth and fifth guide cameras 42/44 in this embodiment then take images of both the gang carrier 52 with the longitudinal multi-sized chip array 62 thereon and the receiver substrate 41. These images are then used by the computer controller 28 to calculate the best positioning of the receiver chuck 40 with respect to gang carrier 52, and moves the receiver chuck 40, with the receiver substrate 41 thereon, in the X, Y and Theta directions (131, 133, and 135) to the proper orientation, as represented in FIG. 4.

Figure 8:
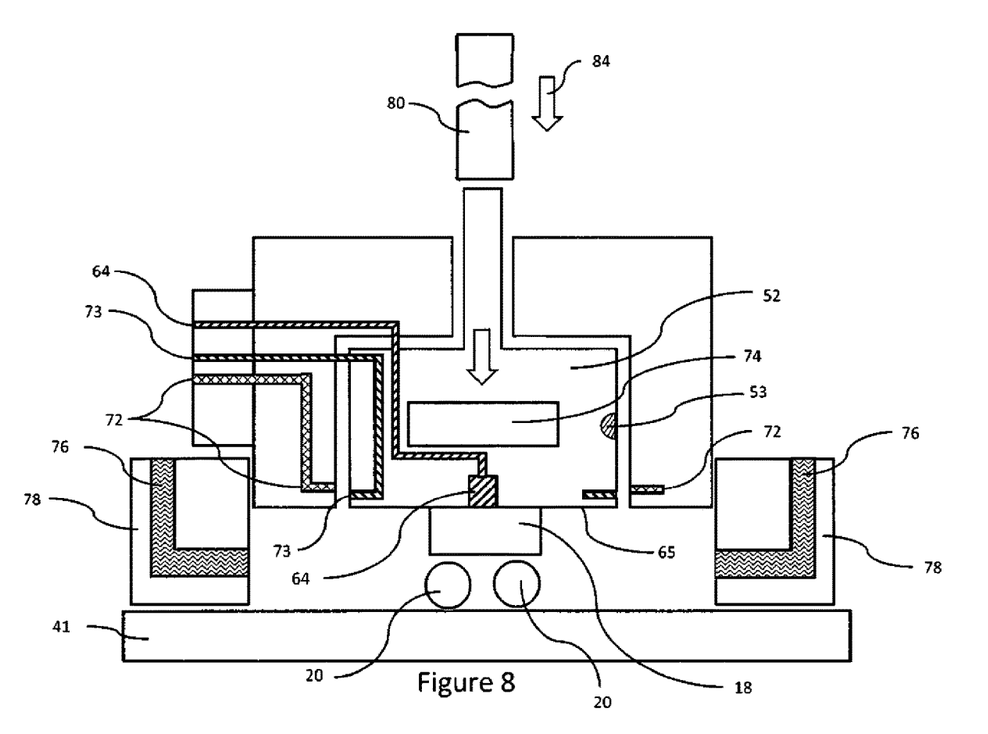
FIG. 8 represents an edge view in cross-sectional detail of a carrier member shown in FIG. 4.

The elongated array 62 of chips 18 on the elongated gang carrier 52 are flipped during their camera and computer monitored transport process from the initial donor chuck 12 to the receiver chuck 40 by the rotation of the gang carrier by the flipper mechanism 60, along its horizontal axis, as shown in FIG. 3, so that the solder bump side of the chips 18 in the elongated chip array 62, are now facing downwardly, if so needed. A vacuum system 64, represented in FIG. 8, is arranged within the elongated gang carrier 52, so as to securely keep the elongated array of solder laden die chips 18 securely thereon during its "flip over" and deposition onto the receiver substrate 41, as represented by the arrow 70, shown in FIGS. 1 and 3. The solder bumps 20 remain on the now downwardly facing side of the chips 18 as represented in FIGS. 1 and 3, by virtue of their earlier heat treatment between the solder bump 20 and the chip 18 before their delivery to the donor chuck 12. The solder bumps 20 become more flatenably compressed, as represented in FIG. 7, in their respective aligned positions to become final integrated circuit product 99 for delivery by the second end effector 11A to further assembly within the electronics industry. The tight accuracy, alignment and electronic communicability between these. vertically and transversely adjacent chips 18 on the receiver substrate 41 enables more powerful integrated circuits 99 for the electronics industry This X-Y-Theta positioning will be held to an accuracy of less than 1 μm by servomotors 132, 134 and 136. The donor chuck 12 as well as the receiver chuck 40 preferably each have an internal heating element 102 and thermal insulation 104, shown in FIGS. 1 through 4, to minimize any heat loss during the systems transfer and flip operation.

The elongated gang carrier 52 is represented in cross-section in FIG. 8. The elongated gang carrier 52 includes vacuum channels 64 along its die chip contacting surface 65 to hold the die chips 18 with solder balls 20 thereon during its flipping operation, the flipping operation represented by that arrow 70 in FIG. 1. The elongated gang carrier 52 also includes a temperature monitoring thermocouple 53, for monitoring/controlling through the computer 28, the temperature profile within that gang carrier 52, shown in FIG. 8. The gang carrier 52 also includes channels 72 for introducing a formic acid (FA) and nitrogen ($N_2$) gas mixture into the die chip 18 environment and an elongated central heater 74 to heat the gang carrier 52 while the die chips 18 are still loaded thereon. Channels for pure nitrogen 73 run in close proximity to the central heater 74 to facilitate as needed, rapid cooling of the heater 74 and gang carrier 52. An exhaust shield 78 with internal exhaust channels 76 is mounted so that it surrounds the bottom edge of the gang carrier 52 when the gang carrier 52 is in its chip deposition orientation. The exhaust channels 76 draw off excess FA and nitrogen process gases to remove surface oxides, and of the flow of formic acid and nitrogen to create a low oxygen environment. When the gang carrier 52 flips to its chip deposition orientation, it comes to rest beneath a longitudinally displaceable compression rod 80. This compression rod 80 is driven by a pneumatic actuator 82 controlled by a computer or controller 28 through the proper circuit 30 and applies a downward compression force 84 to the heated gang carrier 52 and the chips 18 held thereon to enable the downwardly directed solder balls 20 (and their respective chips 18) to be compressed and bonded to the receiver substrate 41, or, on top of already deposited chips 18 as represented by the stackings 85 represented in FIG. 7. Adjacent (vertical chips 19 or horizontal chips 18, as shown in FIG. 7), through their respective compressed solder balls 20 may thus be in communication with one another by virtue of their individual inner circuitry to constitute an integrated circuit 99 useful in the electronics industry. The compressive force 84, represented in FIG. 8, may be controlled through the use of a load cell 81 mechanically linked to the compression rod 80.

A verification camera 90, is located above the receiver chuck 40 shown looking downward on the right-hand side in FIG. 1. The verification camera 90 is configured such that it is capable of higher resolution than the first, second, third, fourth and fifth guide cameras (26, 34, 36, 42, 44). The verification camera 90 is used to confirm the spatial accuracy and repeatability of the chip 18 transfer to the receiver substrate 41.

Figure 9:
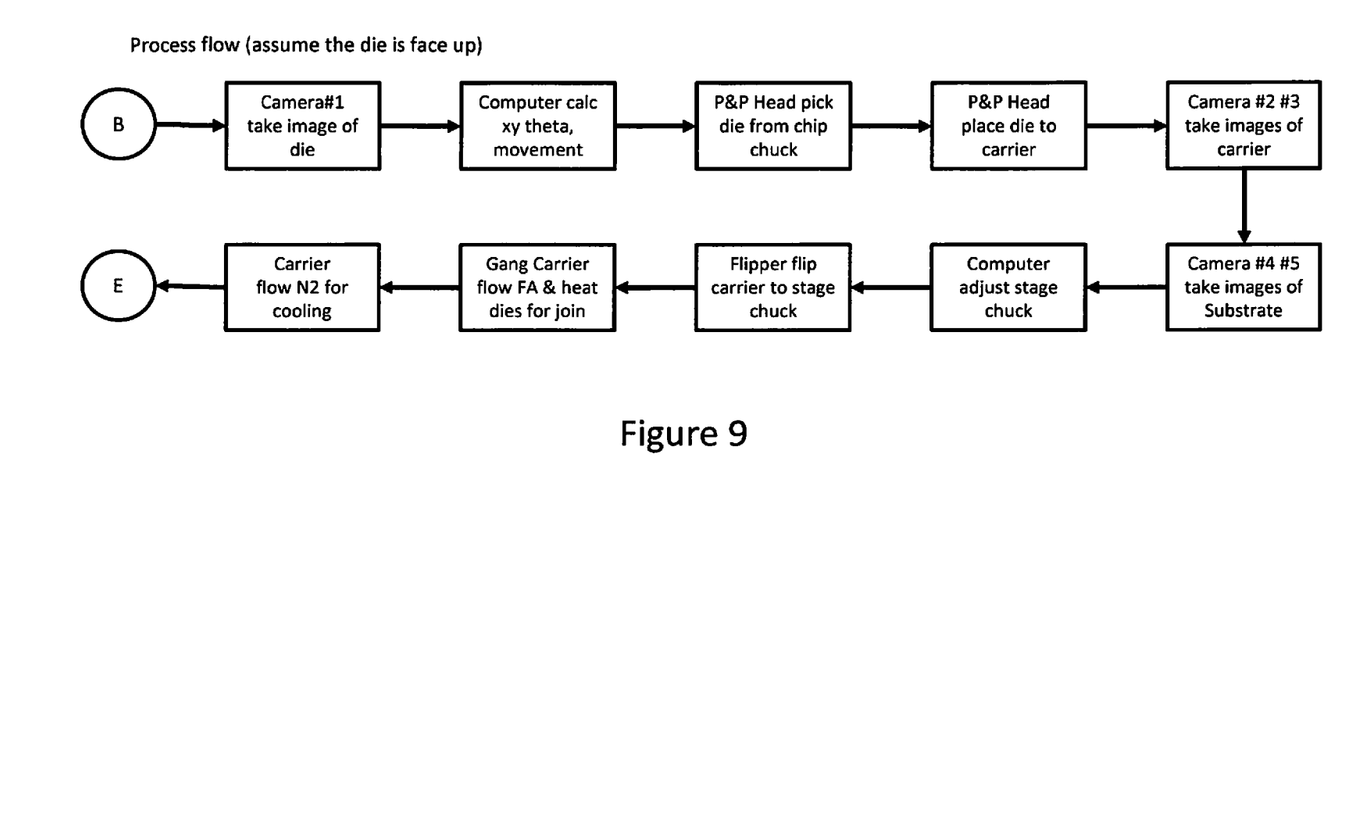
FIG. 9 is a flowchart of the process of the present invention.

The flow process depicted generally in FIG. 9, in a step-by-step description is as follows:

Guide camera 1 takes images of the chip pattern on the donor tape frame and cameras 2 and 3 take images of the fiducial marks on the gang carrier;

the computer calculates the offsets based on the analysis of the images from cameras 1, 2, and 3;

a pick and place carrier picks a chip from the tape frame or tray on the donor chip chuck;

the pick and place carrier places the die chip on to the gang carrier while the gang carrier is in a horizontal and die chip receiving orientation;

Cameras 2 and 3 take images of the chip configuration on the gang carrier and cameras 4 and 5 take images of the receiver substrate; In another embodiment cameras 4 and 5, in conjunction with a beam splitter, also take images of the gang carrier while it is in a vertical alignment orientation;

the computer calculates the offsets based on the analysis of the images from cameras number 2, 3, 4 and 5;

the receiver chuck adjusts its position according to the offset determined by the computer;

the flipper mechanism flips the elongated gang carrier to its proper horizontal and chip bonding orientation;

the elongated gang carrier begins flow of formic acid gas therewithin;

the elongated gang carrier leaves the die chip vacuum held thereon;

the compression rod drives downward and applies a controlled amount of vertical force to the gang carrier and the elongated die chip array thereon;

the gang carrier goes through preset temperature profile;

the gang carrier turns off the die chip-holding vacuum;

the gang carrier begins flow of nitrogen gas; and the flipper mechanism returns the elongated gang carrier, now released of an elongated array of die chips, to its receiving position for a new set of die chips to be placed thereon by the pick and place gripper-to-carrier mechanism.

The invention claimed is:

1. A system for the simultaneous assembly of multiple die chip onto a receiver substrate, the system comprising:
    a donor chuck configured for supporting a plurality of die chip;
    a receiver chuck configured for supporting the receiver substrate;
    a pick and place gripper mechanism configured for retrieving each of the plurality of die chips from the donor chuck;
    a gang carrier configured for receiving each of the plurality of die chips from the pick and place gripper mechanism and supporting the plurality of die chips;
    a flipper mechanism configured for simultaneously delivering the plurality of die chips received by the gang carrier, to a deposition position on the receiver substrate, in an inverted orientation relative to the orientation when received by the gang carrier from the pick and place gripper mechanism; and
    a plurality of interconnected inspection cameras controlled by a computer controller, said plurality of interconnected inspection cameras configured to ensure accurate alignment of the plurality of die chips with respect to the deposition position of the receiver substrate;
    wherein the gang carrier has a thermocouple-controlled heating element therein to maintain a proper computer-controlled temperature therewithin.

2. The system as recited in claim 1, wherein the gang carrier is configured for receiving a plurality of die chips having different sizes.

3. The system as recited in claim 1, wherein the gang carrier includes a first channel configured for introducing a formic acid and nitrogen gas mixture around the plurality of die chips received by the gang carrier to remove surface oxides, and to create a low oxygen die chip environment within the gang carrier.

4. The system as recited in claim 1, wherein the gang carrier is configured to support a longitudinal array of the plurality of die chips thereon.

5. The system as recited in claim 1, wherein the gang carrier includes a vacuum channel arrangement within the gang carrier configured for holding securely the plurality of die chips received from the pick and place gripper mechanism.

6. The system as recited in claim 3, wherein the gang carrier includes a second channel configured for introducing nitrogen around the thermocouple-controlled heating element and the plurality of die chips received from the pick and place gripper mechanism for cooling the plurality of die chips.

7. The system as recited in claim 3, wherein the gang carrier includes an exhaust shield having an exhaust channel to remove used nitrogen and formic acid vapors from the low oxygen die chip environment.

8. An arrangement for the manufacture of a die chip assembly onto a receiver substrate, comprising:

a donor chuck configured to support on an upper surface thereof a chip carrier with a preassembled die chip arrangement thereon;

a receiver chuck configured to support on an upper surface thereof the receiver substrate;

a guide camera guided die chip gripper for removing a preassembled die chip from the chip carrier and depositing the preassembled die chip onto a guide camera monitored die-chip-heating gang carrier;

a gang carrier and preassembled die chip flipper for inverting the gang carrier and the preassembled die chip from an original orientation as provided on the donor chuck to a second orientation rotated by 180°, wherein the gang carrier and preassembled die chip flipper transports the gang carrier and preassembled die chip in the second orientation to a deposition position over the receiver substrate; and a compression rod positioned to apply a compressive force to the gang carrier to compress and bond the preassembled die chip onto the receiver substrate.

9. The arrangement as recited in claim 8, wherein the receiver chuck is displaceable, vertically, rotationally and transversely via servomotors to position the receiver substrate at a predetermined location relative to the deposition position of the gang carrier for deposition of preassembled die chip from the gang carrier to the receiver substrate.

* * * * *